United States Patent
Cole

(10) Patent No.: US 6,680,644 B2
(45) Date of Patent: Jan. 20, 2004

(54) DIGITAL INTERPOLATION WINDOW FILTER FOR PHASE-LOCKED LOOP OPERATION WITH RANDOMLY JITTERED REFERENCE CLOCK

(75) Inventor: Steven R. Cole, San Jose, CA (US)

(73) Assignee: Siemens Information & Communication Networks, Inc., Boca Raton, FL (US)

( * ) Notice: Subject to any disclaimer, the term of this patent is extended or adjusted under 35 U.S.C. 154(b) by 0 days.

(21) Appl. No.: 09/965,365

(22) Filed: Sep. 26, 2001

(65) Prior Publication Data

US 2003/0058013 A1 Mar. 27, 2003

(51) Int. Cl.[7] ................................................. H03K 5/00
(52) U.S. Cl. ........................ 327/551; 327/552; 708/300
(58) Field of Search ................................. 327/551, 552, 327/156, 559, 34; 331/1 A; 708/300

(56) References Cited

U.S. PATENT DOCUMENTS 4,791,386 A * 12/1988 Shiga .......................... 331/1 A
6,424,687 B1 * 7/2002 Tian et al. ................... 327/160

FOREIGN PATENT DOCUMENTS

JP          11186906          * 7/1999

* cited by examiner

Primary Examiner—Dinh T. Le

(57) ABSTRACT

A system and method for filtering a jittered clock is disclosed. The filter of the present invention may check if a reference clock is received at a point in time within a pre-defined window of time. If the clock is received at a point in time within the window, the reference clock may be utilized as a reference for a system application such as a reference for a phase-locked loop. If the reference clock is not received at a point in time within the window, an interpolated clock representing an ideal received clock may be utilized. This may minimize the disturbance of system applications by blocking extreme deviations of the reference clock.

33 Claims, 9 Drawing Sheets

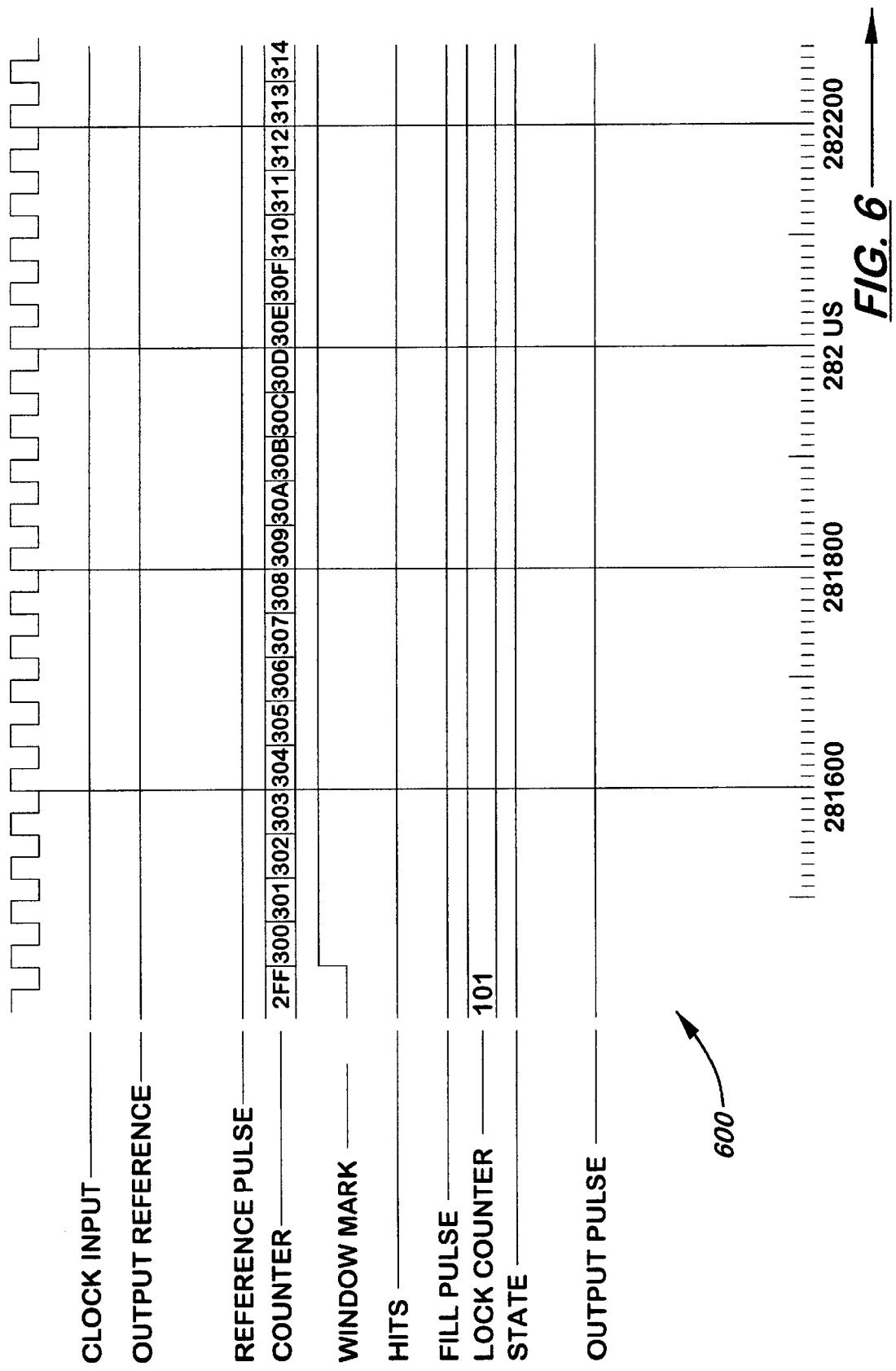

DIGITAL INTERPOLATION WINDOW FILTER FOR PHASE-LOCKED LOOP OPERATION WITH RANDOMLY JITTERED REFERENCE CLOCK

BACKGROUND OF THE INVENTION

1. Field of the Invention

The present invention relates generally to electronic systems and applications utilizing phase-locked loops, and more specifically to a method and system to filter a randomly jittered clock.

2. Description of the Related Art

Phase-locked loops are widely known in the art of electronics and are utilized in many applications of electronics to control the frequency and phase of a signal. One application of phase-locked loops is the recovery of a transmission clock from a data communications medium. When a reference clock for a phase-locked loop is randomly jittered, successive cycles of the clock exhibit a non-linear deviation in phase. Random jitter in a reference clock causes the phase-locked loop to perform poorly, which in turn, leads to inadequate performance of a system in which the phase-locked loop is providing a main system clock.

Solutions to prevent jitter created by the reference clock to the phase-locked loop have been inadequate due to high cost and difficulty in implementation. A first method of removing jitter known to the art involves the use of a digital phase-locked loop followed by an analog phase-locked loop. Another method of removing jitter involves the use of a robust analog phase-locked loop and a voltage controlled crystal oscillator along with a sophisticated active low-pass filter. While each of these methods may reduce clock jitter, each is accompanied by large manufacturing costs.

SUMMARY OF THE INVENTION

Accordingly, the present invention is directed to a novel system and method of filtering a clock reference which may be accompanied by random jitter. In a first aspect of the present invention, a filter of the present invention may block extreme deviations of the reference clock. In an exemplary embodiment of the present invention, the filter of the present invention may check that a reference clock is received within a pre-defined window. When a clock reference is received within the window, it may pass and be utilized in a system application. A reference clock may be ignored when the reference clock is not received within the window. When a reference clock is not received within the window, an interpolated clock representing an ideal received clock may be utilized as a reference. In another aspect of the present invention, the filter of the present invention may reject high-frequency jitter while allowing low-frequency jitter to pass. In an exemplary embodiment of the present invention, the filter of the present invention may be capable of automatically centering itself to allow low-frequency jitter to be tracked while rejecting the high-frequency jitter.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
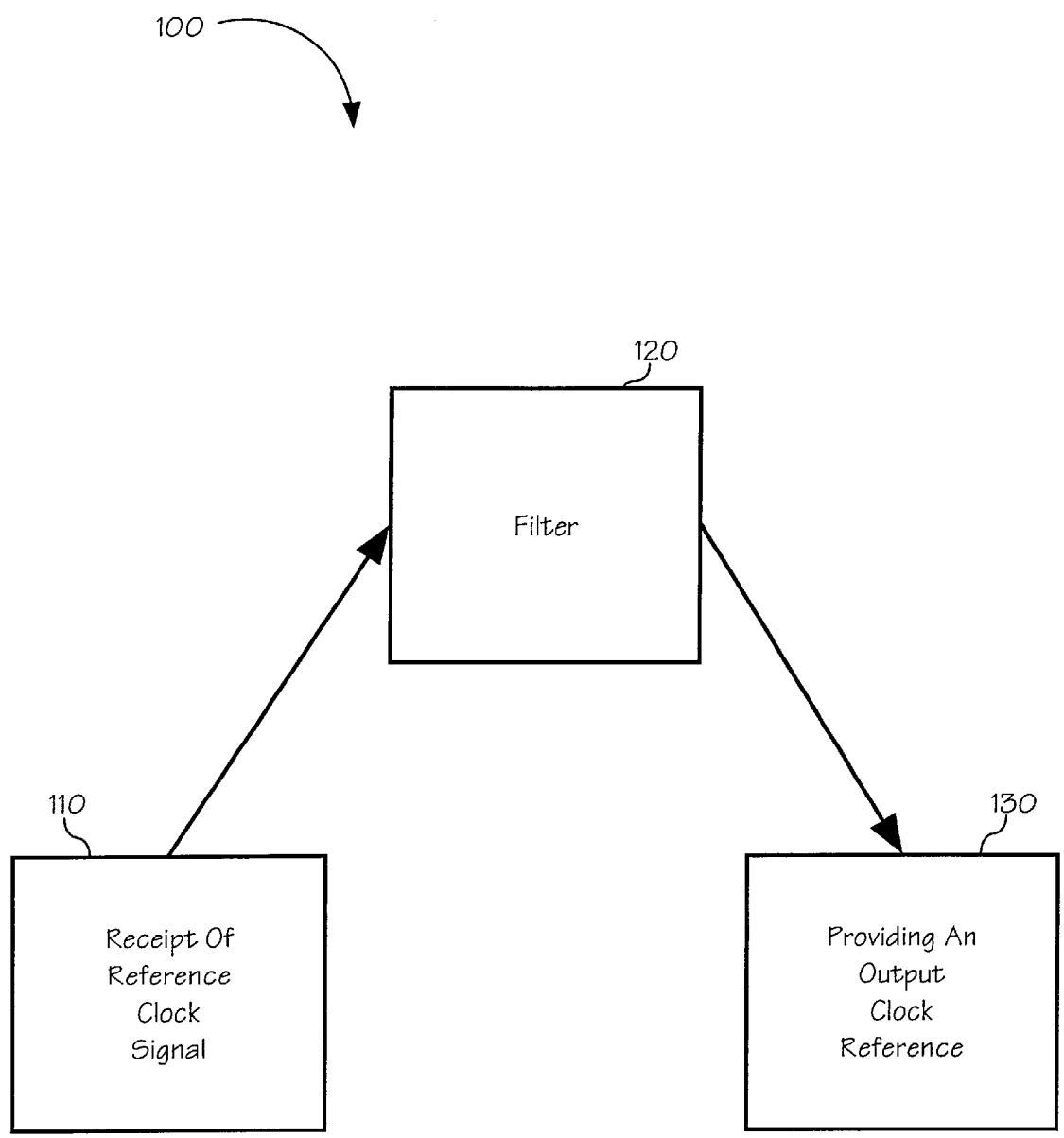
FIG. 1 is a block diagram illustrating an exemplary embodiment of a system of a process for filtering a clock reference.

Referring to FIG. 1, an embodiment of a process 100 for filtering a jittered reference clock is shown. Process 100 may include the receipt of a reference clock 110, filtering of the reference clock 120, and providing an output reference clock 130. Reference clock 110 may be accompanied with random jitter which may create inadequate performance for a phase-locked loop which utilizes reference clock 110 as a clock reference. Filtering of the reference clock 120 may check whether reference clock 110 is received at a point in time within a pre-defined window. A pre-defined window may be a range in time in which the reference clock 110 may be received which may allow for adequate performance in a phase-locked loop which utilizes reference clock 110 as a reference. The range of time of a window may be set in order to obtain a desired percentage of received reference pulses at a point in time within the window. As the width of the window is reduced, high-frequency jitter may be attenuated. However, if the window is too narrow the window may not pass enough received reference pulses within the window to allow a phase-locked loop to keep synchronization with the reference clock 110. It should be understood by those skilled in the art that the pre-defined window may be adjusted as required for an desired application without departing from the scope and spirit of the present invention.

When reference clock 110 may be received at a point in time within a pre-defined window of filter 120, the reference clock may be passed through the filter 120. As a result, output clock signal 130 may be representative of reference clock 110. If the reference clock 110 is not received at a point in time within a pre-defined window of filter 120, reference clock 110 may be ignored and may not pass through filter 120. Filter 120 may produce an output clock reference 130 which may be an interpolated clock representing an ideal received clock. This may be advantageous as disturbances to an attached phase-lock loop may be minimized by blocking extreme deviations of reference clock 110. While embodiments of the invention include the filtering of a reference clock 110 to ensure proper functioning of a phase-locked loop, it should be understood by those with ordinary skill in the art that other types of applications may be utilized without departing from the scope and spirit of the present invention.

Figure 2:
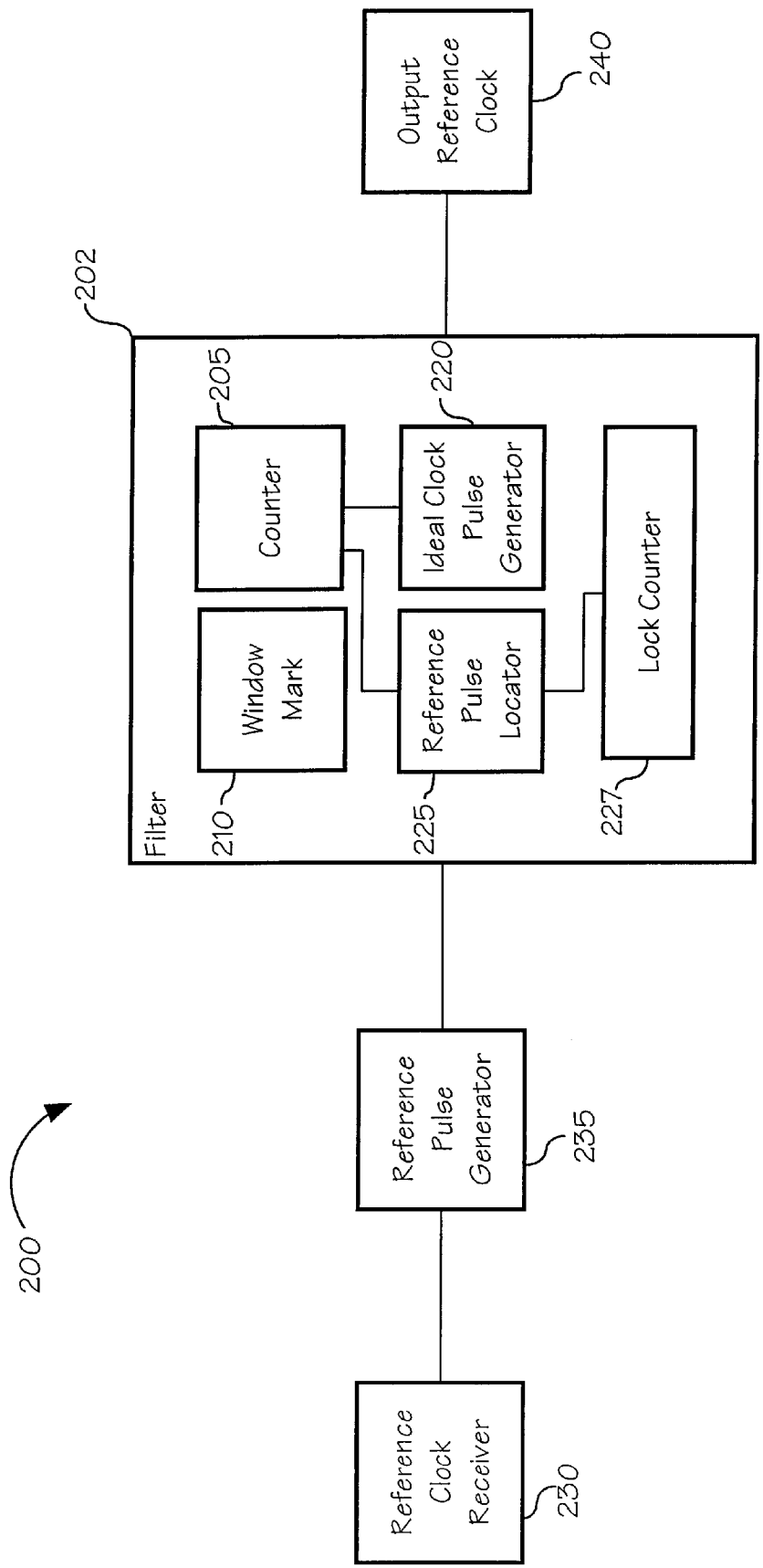
FIG. 2 is a block diagram representing an exemplary embodiment of a system of the present invention.

Referring now to FIG. 2, a block diagram representing an exemplary embodiment of a system 200 of the present invention is shown. A clock reference may be received by a reference clock receiver 230. At such time, a reference pulse generator 235 may derive a reference pulse from a leading edge of the clock reference received by reference clock receiver 230. Filter 202, in an embodiment of the invention, may include a counter 205, a window mark 210, an ideal clock generator 220, a reference pulse locator 225, and a lock counter 227. Counter 205 may be utilized to control the operation of the filter 120. Filter 202 may operate by simultaneous operation of the counter 205, window mark 210, ideal clock generator 220, and reference pulse check 225. For example, reference pulse locator 225 may analyze the reference pulse produced by generator 235 to determine whether it has been received at a point in time within window mark 210. Window mark 210 may identify a starting point in time and an ending point in time of the window of the present invention.

Timing of the filter 120 may be maintained by counter 205. If the reference pulse is received at a point in time within the window mark 210, reference pulse may be used as output pulse 240. If the reference pulse is received at a point in time outside of window mark 210, an interpolated clock pulse may be generated by clock pulse generator 220. Then, the interpolated clock pulse may be utilized as output pulse 240. A lock counter 227 may be utilized to determine if the system is operating in a locked or unlocked state. When in an unlocked state, the lock counter may place the system in to a locked state when a reference pulse is received. When the system is in a locked state, the lock counter may check that the circuit will stay locked until a certain number of consecutive reference pulses have been received at a point in time outside of the window. This may ensure that the system does not stay in a false locked state caused by the re-centering of the window according to an arbitrary pulse. As long as there are a certain percentage of reference pulses received at a point in time within the window, the system may be operating correctly.

It should be understood that the embodiment of the present invention as shown and described in FIG. 2 may be representative of the functionality of a system of the present invention only, and, that particular components of the system may not be present in a hardware or software fashion. FIG. 2, in an alternative embodiment of the present invention, may represent the functionality of the system rather than specific components and subsystems.

Further, it should be understood by those with ordinary skill in the art that the embodiment of the implementation 200 may be configured in several ways. For example, software may be utilized to filter a reference clock. A program of instructions, such as source code, may be written and executed by a processor or microprocessor to filter a reference clock. In an exemplary embodiment of the present invention, very high speed integrated circuits hardware description language (VHDL) may be utilized describe hardware circuits that are implemented in programmable logic devices or application specific integrated circuits. While VHDL code may be utilized, other hardware description languages may be utilized by those with ordinary skill in the art in order to achieve similar results without departing from the scope and spirit of the present invention.

Boolean logic devices may also be utilized to form the filter 120 of the present invention. Simple logic gates may be arranged in a fashion by one of ordinary skill in the art in order to accomplish the filtering of a reference clock to remove extreme deviations in the reference clock caused by random jitter. In another embodiment of the invention, programmable logic devices may be utilized to perform filtering of a reference clock in accordance with the present invention. Programmable logic devices may include configurable logic and flip-flops linked by a programmable interconnect. One example of a programmable logic device may be a field programmable gate array which may consist of an array of logic blocks, surrounded by programmable I/O blocks, and connected with programmable interconnect. In yet another embodiment of the present invention, source code written in VHDL may be utilized in combination with a programmable logic device in an implementation of the present invention. It should be understood that the embodiments of implementation 200 described and shown in FIG. 2 is not exclusive and other methods of filtering a reference clock may be utilized separately or in combination with those described by one of ordinary skill in the art without departing from the scope and spirit of the present invention.

Figure 3:
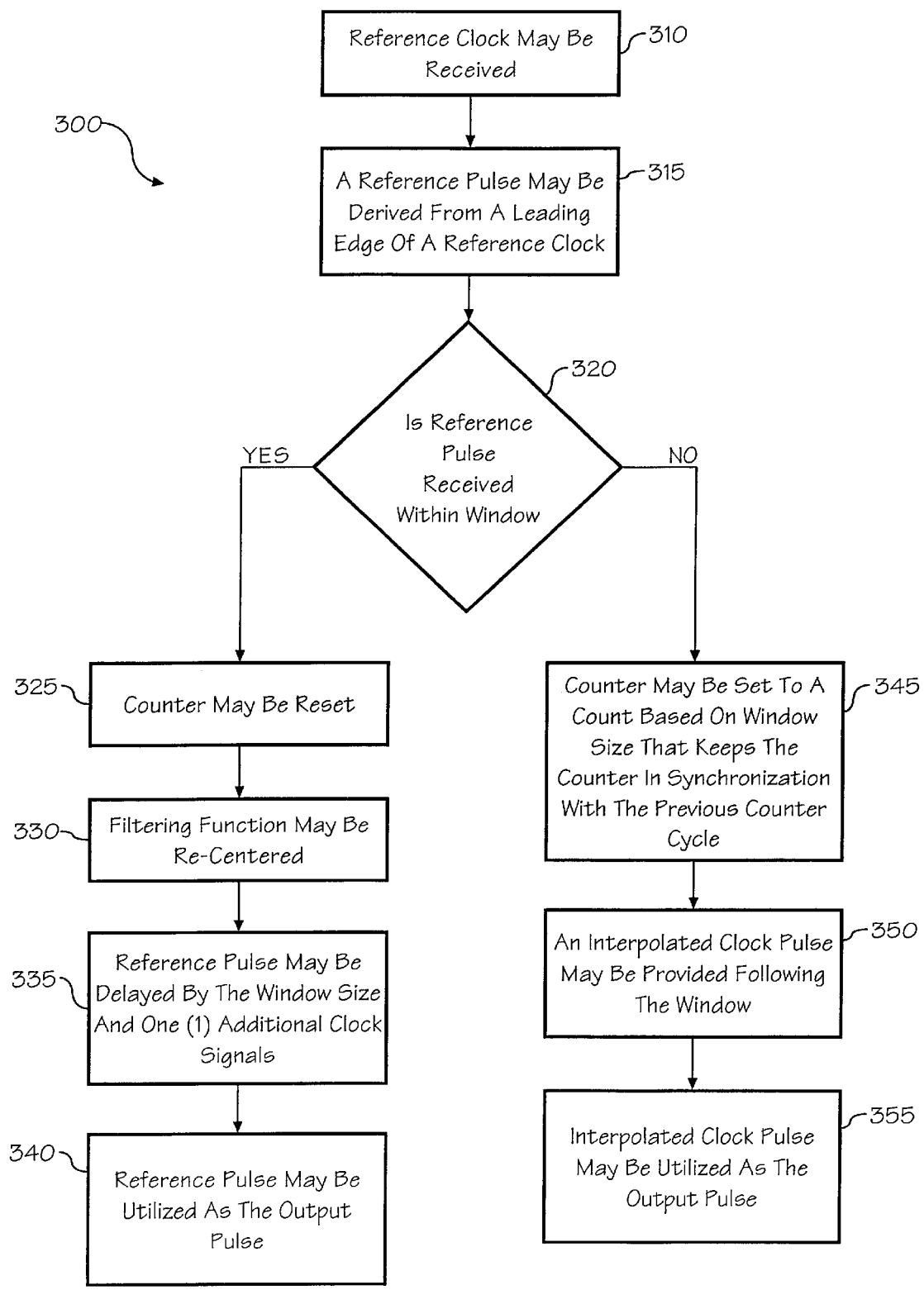
FIG. 3 is a flow diagram illustrating a method for filtering a reference clock in accordance with an exemplary embodiment of the present invention.

Referring to FIG. 3, a flow diagram illustrating a method 300 for filtering a reference clock in accordance with an exemplary embodiment of the present invention is shown. Method 300 may begin when a reference clock may be received 310. A reference pulse may be derived from a leading edge of a received reference clock 315. Method 300 may determine whether the reference pulse has been received at a point in time within a window of the present invention 320. This may be accomplished in an embodiment of the present invention as shown and described in FIG. 2.

If the reference pulse is received at a point in time within a window, the counter of the present invention may be reset 325. This may allow the filtering function to be re-centered 330. This may be advantageous as it may allow the filter of the present invention to track low-frequency jitter while rejecting high-frequency jitter. A common application of a phase-locked loop is in recovering a transmission clock of a data communications link. A fundamental aspect of this application is that the system using the recovered clock as a reference must operate at the same average frequency as the system providing the transmission clock. Due to effects, such as temperature, the frequency of the transmission clock may drift over time. The phase-locked loop on the recovered clock system must be able to follow this low-frequency jitter, or wander, of the transmitter. At the same time, the phase-locked loop should "clean-up" the recovered clock by attenuating the high-frequency component of the clock jitter. The reference pulse may be delayed by the size of the window and one (1) additional clock signals 335. This may ensure that the reference output pulse may be necessarily delayed to allow checking of the entire window for late pulses. The reference pulse after the delay may be utilized as the output pulse 340. The output pulse may drive an output reference clock which may be utilized as a clock reference for system application such as a clock reference for a phase-locked loop. If the reference pulse is not received within a window 320, the counter of the present invention may be set to a count based on the window size that may keep the counter in synchronization with the previous counter cycle 345. This may be advantageous as it prevents the re-centering of the filter to a "bad" clock. An interpolated clock pulse may be provided following the window 350. The interpolated clock pulse may represent an ideal clock free of any random jitter. Interpolated clock pulse may be utilized as the output pulse 355. Output pulse may drive an output reference clock which may be utilized as a clock reference for system application such as a clock reference for a phase-locked loop. Output reference clock may be utilized, in an embodiment of the invention, to drive a counter that produces an output clock that has a nominal duty cycle of 50%.

An advantageous aspect of a system and method of the present invention is the ability to place itself in a locked and unlocked state. When the system of the present invention is in an unlocked state, any received reference pulse may place the system into a locked state. When the system is in a locked state, it may stay locked until a certain number of consecutive missed pulses are received. A missed pulse may be a reference pulse that is not received at a point in time within a window of the present invention. For example, in an embodiment of the invention, the circuit may stay locked unless two (2) to the power of a number of lock bits less one (1) missed pulses is received. If the number of lock bits is three (3), then the system may stay locked until seven (7) missed pulses are received. If, in this example, seven (7) missed pulses are received, the application may be terminated. This may be advantageous as it may ensure that the system does not stay in a false locked state.

Figure 4:
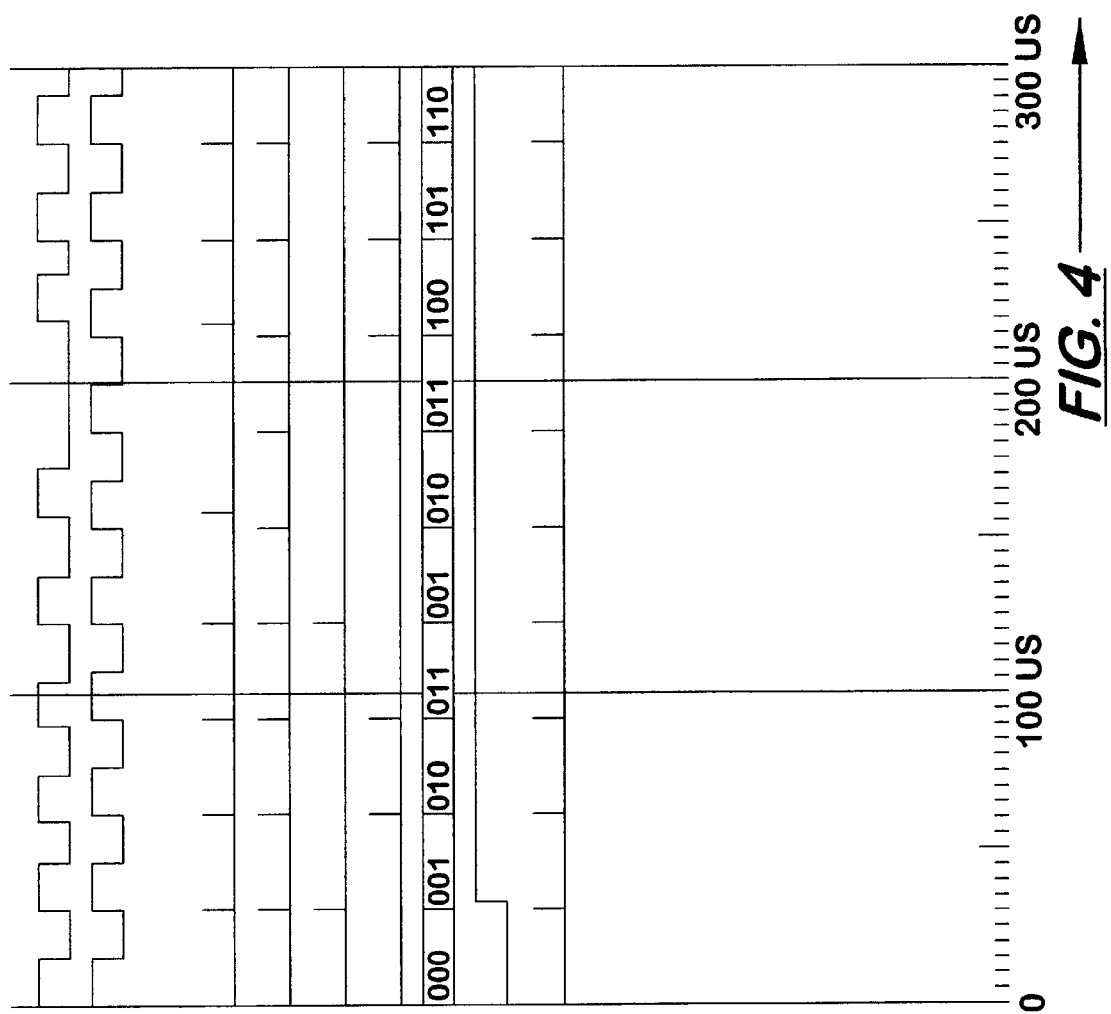
FIG. 4 is an illustration depicting exemplary operation of a system of the present invention according to an embodiment of the present invention.
Figure 4:
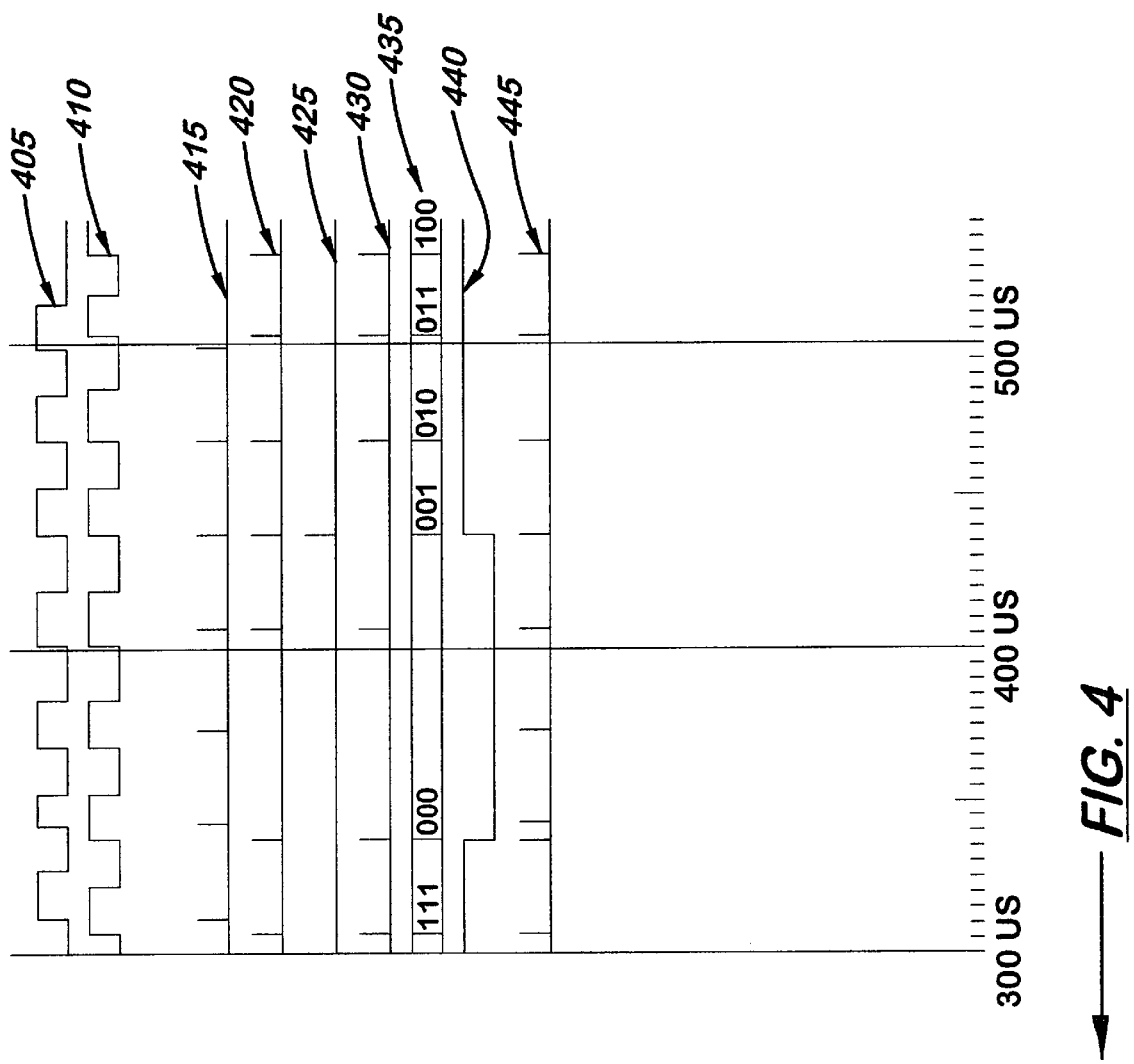

Referring to FIG. 4, an illustration depicting exemplary operation 400 of a system of the present invention according to an exemplary embodiment of the present invention is shown. Clock reference signal 405 may be filtered by the system of the present invention to produce the output reference signal 410. As the clock reference signal 405 is received, a reference pulse 415 may be derived from the leading edge of the clock reference signal 405. A window mark signal 420 may represents the range of time of a window in which hits 425 may be received. Window mark 420 may represent a starting point in time and an ending point in time of the window. Hits 425, may represent when a reference pulse 415 are received at a point in time within window mark 420. A fill pulse 430 may represent an interpolated clock pulse and may be utilized when a reference pulse 415 is not received at a point in time within window mark 420. Lock counter 435 may determine if the system is in a locked or unlocked state. The system may be in a locked state 440 upon a hit and is changed to an unlocked state after seven (7) missed pulses as described in an exemplary fashion in FIG. 3. The output pulse 445 may reflect a delayed reference pulse after a hit and a fill pulse 425 upon a miss.

Figure 5:
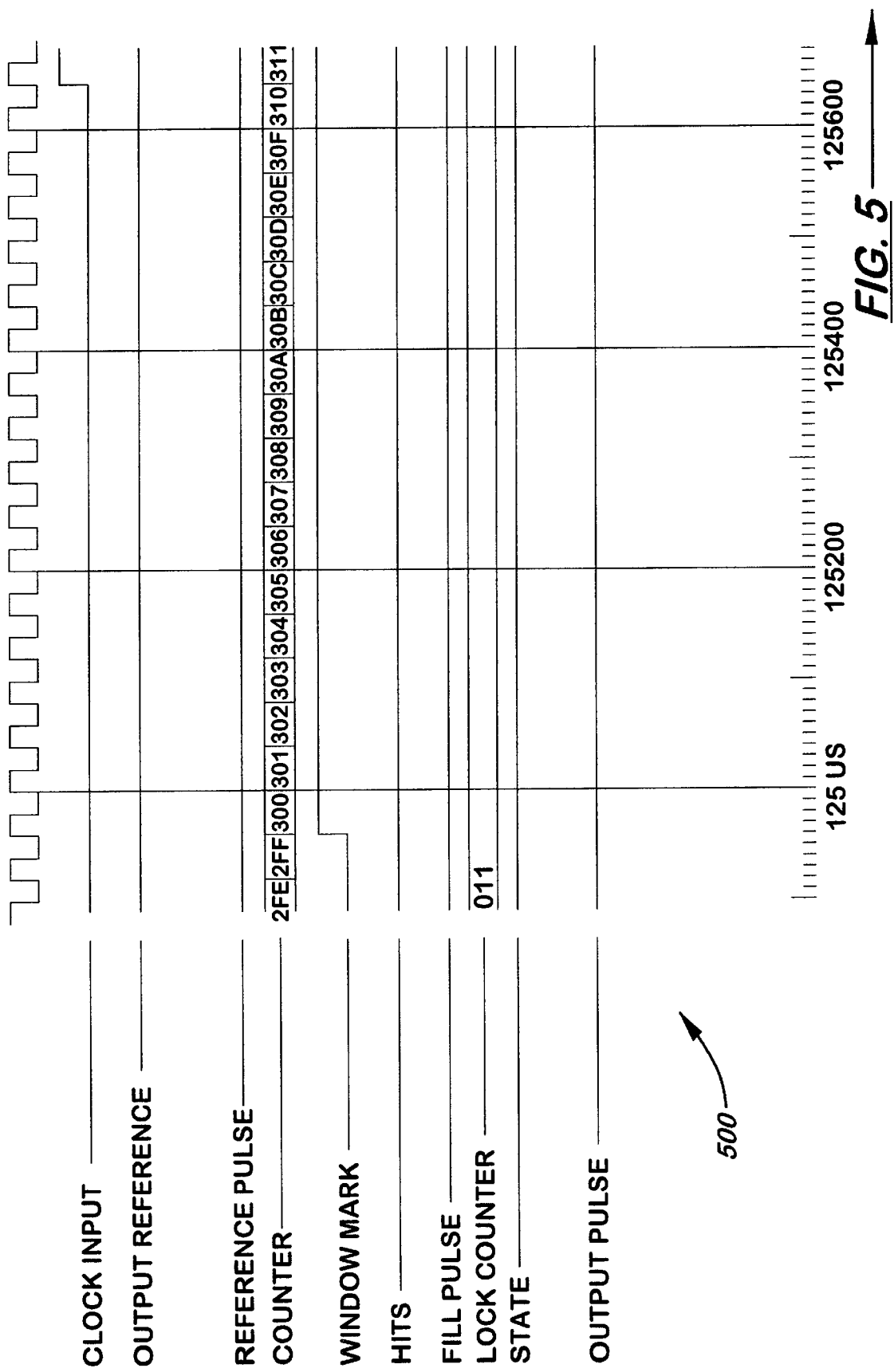
FIG. 5 is an illustration depicting exemplary operation of a system of the present invention when a reference clock is received within a window according to an embodiment of the present invention.
Figure 5:
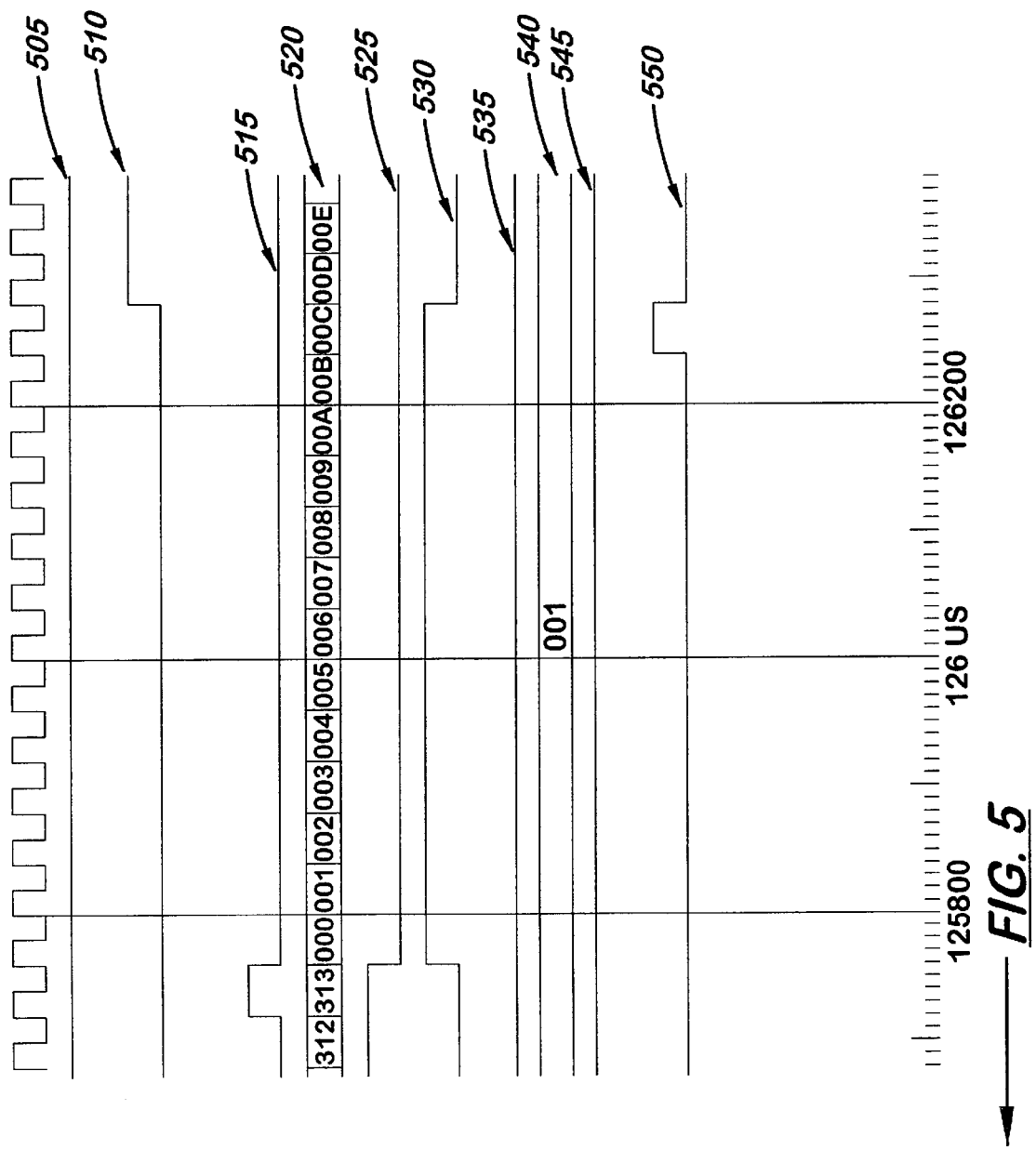

FIG. 5 shows an illustration depicting exemplary operation of a system of the present invention when a reference clock is received at a point in time within a window 500 according to an exemplary embodiment of the present invention. In this example, the center of the window may be set at count 30C which may a number of interval clock cycles since the last "good" reference pulse, or alternatively named as a hit 530. The window size may be set at 12, thus the actual range of the window may be twelve counts before the center to twelve counts after the center. In this example, the window is located from count 300 to count 318.

A clock input 505 may be received. Upon receipt, a reference pulse 515 may be derived from clock input 505. Reference pulse 515 may be present at a point in time within window mark 525, thus a hit is shown in 530. Reference pulse 515 may be delayed by a shift register, thirteen counts (window size plus 1) as described in FIG. 3. Output pulse 550 is representative of reference pulse 515 and the delay. Fill pulse 535 is not required as there has been a hit. Counter 520 may be reset upon the hit. Lock counter 540 may determine if the system is in a locked state or unlocked state, the state of the system may be reflected as locked as shown state 545. The output pulse 550 may drive output reference clock 510.

Figure 6:
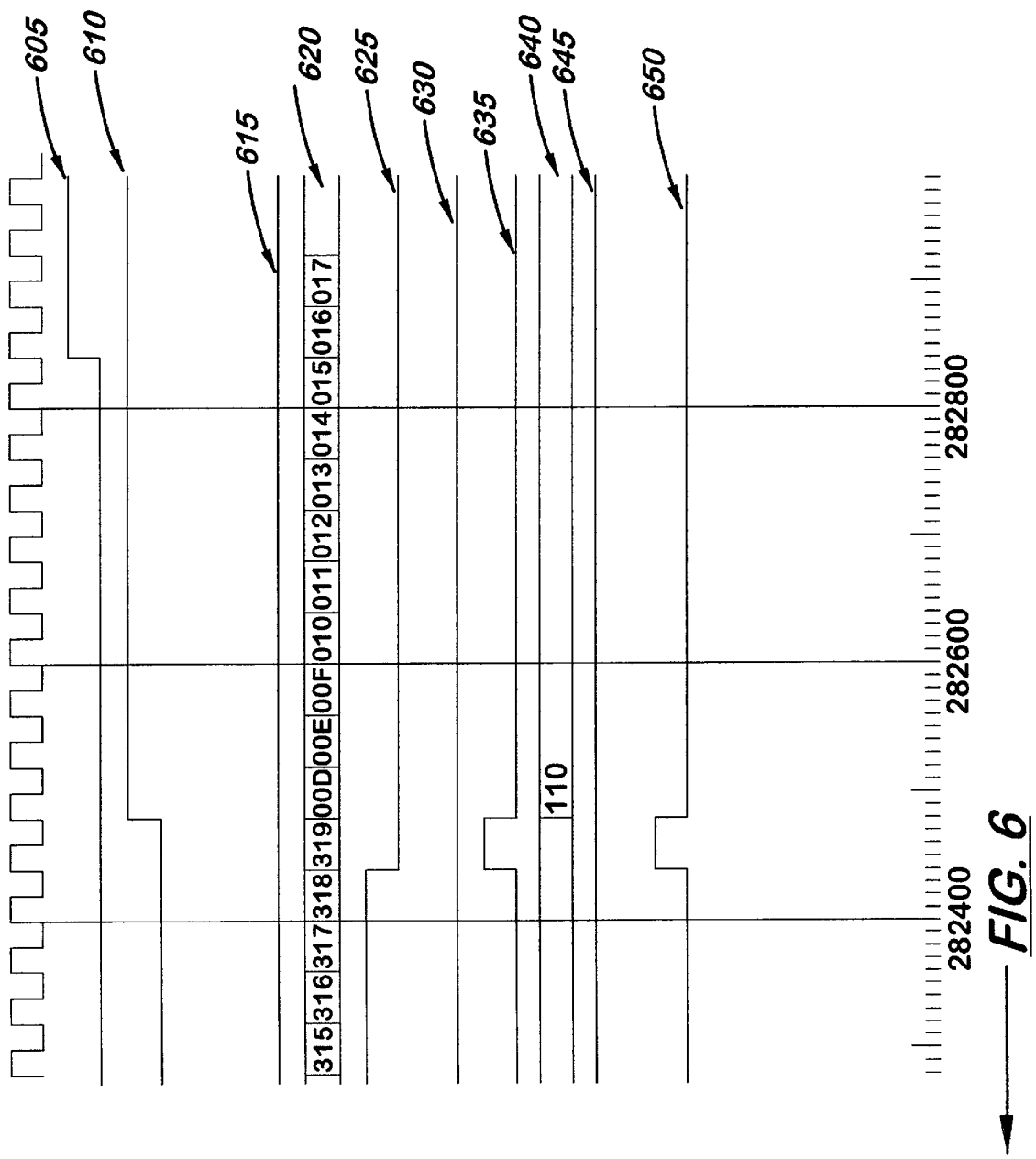
FIG. 6 is an illustration depicting exemplary operation of a system of the present invention when a reference clock is not received within a window according to an embodiment of the present invention.

Referring to FIG. 6, an illustration depicting exemplary operation of a system of the present invention when a reference clock is not received within a window 600 according to an exemplary embodiment of the present invention is shown. FIG. 6 is similar to the input conditions of FIG. 5, however, in this example, a reference pulse is not received at a point of time within a window.

A clock input 605 may not be received as its reference pulse 615 may not be received at a point in time within window mark 625. Since the reference pulse is outside of the window, this is a miss, and consequently there are no hits 630. Output pulse 650 is created by fill pulse 635 which follows the window mark 625 as described in FIG. 3. Fill pulse 635 may represent an interpolated clock signal as described in FIGS. 1–3. Counter 620 may be set by the fill pulse to a count of 00D (window size plus 1) to maintain counter continuity with an ideal counter center at count 30C and the new interval count beginning in the following clock cycle. Lock counter 640 may be incremented by the fill pulse and may determine if the system is in a locked state or unlocked state, the state of the system may be reflected as locked as shown state 645. Output pulse 650 may drive output reference clock 610.

It should be understood that embodiments of exemplary operation as shown in described in FIGS. 3–6 were examples of the present invention only. Other examples of operation may be utilized by one of ordinary skill in the art without departing from the scope and spirit of the present invention. Further, it is believed that the of the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for filtering a reference clock, comprising:
   receiving a reference clock;
   deriving a reference pulse from said reference clock;
   determining whether said reference pulse is received at a point in time within a window, wherein said reference pulse is selected as an output pulse when said reference pulse is received in said point of time within said window; and
   generating an interpolated clock pulse for said output pulse when said reference pulse is not received at said point in time within said window.

2. The method as claimed in claim 1, wherein an output reference clock is produced, said output reference clock being derived from said output pulse and said reference clock.

3. The method as claimed in claim 1, wherein said deriving of said reference pulse from said reference clock is accomplished by utilizing a leading edge of said reference clock.

4. The method as claimed in claim 1, wherein said determining whether said reference pulse is present at said point in time within a window, comprises:
   maintaining a timing system;
   checking a starting point in time and an ending point of time of said window; and
   verifying whether said reference pulse is received within said staffing point in time and said ending point of time of said window.

5. The method as claimed in claim 1, wherein said window is a range of time, said range of time being adjustable.

6. The method as claimed in claim 4, wherein a position of said window is set at a desired number of clock cycles from a last reference pulse received at said point in time within said window.

7. The method as claimed in claim 4, wherein said timing system is reset when said reference pulse is received at said point of time within said window.

8. The method as claimed in claim 4, wherein said timing system is set at a count relative to a size of said window to synchronize itself with a previous counter cycle when said when said reference pulse is not received at said point in time within said window.

9. The method as claimed in claim 7, wherein upon a reset of said timing system, said timing system is re-centered upon a last reference clock received at said point in time within said window.

10. The method as claimed in claim 6, further comprising checking that said window is not falsely positioned by an arbitrary pulse.

11. The method as claimed in claim 10, wherein checking that said window is not falsely positioned by an arbitrary pulse is accomplished by terminating said method after a specified number of consecutive reference pulses are not received at said point in time within said window.

12. The method as claimed in claim 1, wherein said interpolated clock pulse is representative of an ideal clock pulse free of random jitter.

13. A method for filtering a reference clock, comprising:
receiving a reference clock;
deriving a reference pulse from said reference clock;
maintaining a timing system;
determining whether said reference pulse is received at a point in time within a window, said window being a range of time and said reference pulse being selected as an output pulse when said reference pulse is received in said point of time within said window; and
generating an interpolated clock pulse for said output pulse when said reference pulse is not received at said point in time within said window.

14. The method as claimed in claim 13, wherein an output reference clock is produced, said output reference clock being derived from said output pulse and said reference clock.

15. The method as claimed in claim 13, wherein said deriving of said reference pulse from said reference clock is accomplished by utilizing a leading edge of said reference clock.

16. The method as claimed in claim 13, wherein said window is a range of time, said range of time being adjustable.

17. The method as claimed in claim 16, wherein a position of said window is set at a desired number of clock cycles from a last reference pulse received at said point in time within said window.

18. The method as claimed in claim 13, wherein said timing system is reset when said reference pulse is received at said point of time within said window.

19. The method as claimed in claim 13, wherein said timing system is set at a count relative to a size of said window to synchronize itself with a previous counter cycle when said when said reference pulse is not received at said point in time within said window.

20. The method as claimed in claim 18, wherein upon a reset of said timing system; said timing system is re-centered upon a last reference clock received at said point in time within said window.

21. The method as claimed in claim 17, further comprising checking that said window is not falsely positioned by an arbitrary pulse.

22. The method as claimed in claim 21, wherein checking that said window is not falsely positioned by an arbitrary pulse is accomplished by terminating said method after a specified number of consecutive reference pulses are not received at said point in time within said window.

23. The method as claimed in claim 13, wherein said interpolated clock pulse is representative of an ideal clock pulse free of random jitter.

24. A system for filtering a randomly jittered clock to produce an output reference clock, comprising;
means for receiving a reference clock;
means for deriving a reference pulse from said reference clock coupled to said receiving means;
a counter for maintaining timing of said system coupled to said deriving means;
means for verifying whether said reference pulse is received during a point in time within a window, said verifying means being coupled to said counter; and
means for generating an interpolated clock pulse coupled to said counter; wherein said reference pulse is selected for an output pulse when said reference pulse is received at said point of time within said window, said interpolated clock pulse being selected as said output pulse when said reference pulse is not received within said point of time within said window.

25. The system as claimed in claim 24, wherein said deriving means utilizes a leading edge of said reference clock.

26. The system as claimed in claim 24, wherein said output reference clock is derived from said output pulse and said reference clock.

27. The system as claimed in claim 24, wherein said window is a range of time, said range of time being adjustable.

28. The system as claimed in claim 27, wherein a position of said window is set at a desired number of clock cycles from a last reference pulse received at said point in time within said window.

29. The method as claimed in claim 24, wherein said counter is reset when said reference pulse is received at said point of time within said window.

30. The system as claimed in claim 24, wherein said timing system is set at a count relative to a size of said window to synchronize itself with a previous counter cycle when said when said reference pulse is not received at said point in time within said window.

31. The system as claimed in claim 29, wherein upon a reset of said counter, said verifying means is re-centered upon a last reference clock received within said point in time within said window.

32. The system as claimed in claim 28, further comprising means for checking that said window is not falsely positioned by an arbitrary pulse coupled to said verifying means.

33. The system as claimed in claim 24, wherein said interpolated clock pulse is representative of an ideal clock pulse free of random jitter.

* * * * *